United States Patent [19]

Poutasse, III et al.

[11] Patent Number: 5,622,782

[45] Date of Patent: Apr. 22, 1997

[54] FOIL WITH ADHESION PROMOTING LAYER DERIVED FROM SILANE MIXTURE

[75] Inventors: Charles A. Poutasse, III, Beachwood; Andrea M. Kovacs, Lakewood, both of Ohio

[73] Assignee: Gould Inc., Eastlake, Ohio

[21] Appl. No.: 264,192

[22] Filed: Jun. 22, 1994

Related U.S. Application Data

[63] Continuation of Ser. No. 53,721, Apr. 27, 1993, abandoned.

[51] Int. Cl.$^6$ .................................................. C09J 7/02
[52] U.S. Cl. ...................... 428/344; 428/354; 428/355 R; 428/447; 428/448
[58] Field of Search ................................ 428/447, 901, 428/448, 469, 355, 354, 344; 528/34, 41, 38

[56] References Cited

U.S. PATENT DOCUMENTS

| | | | |
|---|---|---|---|
| 3,585,010 | 6/1971 | Luce et al. | 29/191.2 |
| 3,644,166 | 2/1972 | Gause | 161/89 |
| 4,387,006 | 6/1983 | Kajiwara et al. | 204/32 R |
| 4,639,285 | 1/1987 | Suzuki et al. | 156/272.6 |
| 4,732,858 | 3/1988 | Brewer et al. | 437/228 |
| 4,855,351 | 8/1989 | Stein | 528/34 X |
| 4,867,817 | 9/1989 | Kneafsey et al. | 156/73.1 |
| 5,017,271 | 5/1991 | Whewell et al. | 204/15 |
| 5,071,520 | 12/1991 | Lin et al. | 205/155 |
| 5,140,087 | 8/1992 | Saho et al. | 528/34 X |

FOREIGN PATENT DOCUMENTS

| | | |
|---|---|---|
| 0251490 | 1/1988 | European Pat. Off. |
| 5925297 | 2/1984 | Japan . |
| 55-162367 | 4/1985 | Japan . |
| 219994 | 5/1990 | Japan . |
| 2307294 | 12/1990 | Japan . |

OTHER PUBLICATIONS

"Effects of Substrates on the Structure of Polymer Interphases", Ondrus & Boerio, J. of Colloid & Interface Science, vol. 124, No. 1, Jul. 1988; pp. 349–357.

Copper Foil Technology, "After the Base Foil Production, the Base Material is Subjected to a Variety of Treatment Processes", Bucci et al, (Jul. 1986), pp. 22–33.

"Reminiscing on Silane Coupling Agents", Plueddemann, J. Adhesion Sci. Technol, vol. 5, No. 4, pp. 261–277 (1991).

"Methods for Improving the Performance of Silane Coupling Agents", J. Adhesion Sci. Technol., vol. 5, No. 10, pp. 831–842 (1991).

"Hydrothermal Stability and Description Behavior of the Mixed Silane With a Crosslinking Additive on E–Glass Fibers", Jang et al, pp. 365–380, Dow Corning Corporation.

"Organofunctional Silanes", Union Carbide, (1991).

*Primary Examiner*—Jenna Davis
*Attorney, Agent, or Firm*—Renner, Otto, Boisselle & Sklar

[57] ABSTRACT

This invention relates to a foil having an adhesion promoting layer overlying at least one side of said foil. The adhesion promoting layer is suitable for enhancing adhesion between the foil and another substrate. The adhesion promoting layer is derived from a composition comprising silanes (A) and (B).

Silane (A) is at least one compound represented by the formula

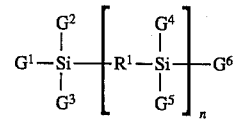

wherein $G^1$, $G^2$, $G^3$, $G^4$, $G^5$ and $G^6$ are independently halogen, hydrocarbyloxy, or hydroxy groups; $R^1$ is a hydrocarbon group or nitrogen-containing hydrocarbon group; and n is zero or 1.

Silane (B) is at least one compound represented by the formula

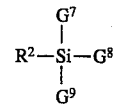

wherein $R^2$ is an organofunctional group, said organofunctional group being reactive with or having an affinity for said another substrate; and $G^7$, $G^8$ and $G^9$ are independently halogen, hydrocarbyloxy, or hydroxy groups.

16 Claims, No Drawings

FOIL WITH ADHESION PROMOTING LAYER DERIVED FROM SILANE MIXTURE

This is a continuation of application Ser. No. 08/053,721 filed on Apr. 27, 1993, now abandoned.

TECHNICAL FIELD

This invention relates to foil and, more particularly, to foil having an adhesion promoting layer overlying at least one side thereof, the adhesion promoting layer being derived from a composition comprising a mixture of at least two silanes. These foils are useful in the manufacture of printed circuit boards (PCBs).

BACKGROUND OF THE INVENTION

PCBs are components of electronic devices which are made from laminates which comprise a conductive foil, usually copper, and a polymeric resin substrate. The conductive foil forms the conductors in electronic devices and the polymeric resin substrate forms an insulation between the conductors. The conductor and insulator are in intimate contact and the adhesion between them contributes to the performance and reliability of the electronic devices made with them.

Electrodeposited and wrought or rolled copper foils used in the manufacture of printed circuit boards do not adhere well to the polymeric substrates. The prior practice for achieving adhesion between copper foil and insulating polymeric substrates has been to roughen the copper surface.

Surface roughening has been achieved by several means. The electrodeposited copper foils can be electroformed with a rough surface. On top of this rough surface further toughening is carried out by applying a high surface area treatment. These treatments may be a copper deposited electrolytically in nodular or powder form, or a copper oxide which grows nodular or dendritic, among others. Often times the rolled copper foil has mechanical roughness imparted to it during rolling or by subsequent abrasion. The rolled foils also are conventionally treated with surface area increasing nodular copper or copper oxide treatments.

These surface roughening treatments increase adhesion to the polymers by forming a mechanical interlock with the resin. The mechanical interlock is formed when an adhesive in its liquid state is applied and then cured or when the resin melts and flows prior to cure during lamination. The polymers flow around the roughened surface area treatments to form the mechanical interlock.

There are several factors contributing to the adhesion measured between the copper foil and the polymeric resin. Some of these are surface area, type of roughness, wettability, chemical bond formation, type of chemical bond, formation of interpenetrating networks, and properties of the adhering materials.

During an adhesion test the interlocked resin and copper often adhere well enough that failure occurs within the resin, cohesive failure. With some resins the mechanical interlocking of treatment and resin does not result in the desired high adhesion and failure occurs at the interface between resin and copper, an adhesive failure.

The surface roughening that has been used to enhance adhesion between copper and polymeric resin substrates cause difficulties in the manufacture of PCBs and contributes to poor PCB performance. In the subtractive copper etching process additional etching time is required to remove the dendrites or nodules embedded in the resin. This not only slows down the production process but contributes to greater line loss due to the lateral etching of the copper line's sidewalls. The surface roughening contributes to poor PCB electrical performance by slowing down high frequency electrical signals. The necessity of having a rough base foil has limited other properties, such as tensile strength and elongation, that produce good laminate and PCB performance. The dendritic or nodular surface roughening treatments are difficult to apply, requiring special equipment in the case of electrolytic treatment, and special chemicals in the case of the oxide treatments.

The copper oxide process for increasing surface roughness is sometimes referred to as a brown or black oxide process. This oxide process includes a number of steps: (1) alkaline clean, (2) water rinse, (3) microetch, (4) acid rinse, (5) rinse, (6) oxidation, and (7) water rinse. This process provides adhesion or peel strength after lamination and post baking of only 2–4 pounds per inch for polyimide innerlayers and 4–6 pounds per inch for tetrafunctional epoxy innerlayers. Because of this limited adhesion, the interface between the oxide of the copper foil and the resin sometimes delaminates or fractures during the drilling process of making multilayer PCBs. The fractured interface near the edge of the drilled holes is prone to attack by acids during subsequent PCB processes. Acid sometimes leaches into the interface area around the drilled holes and dissolves the copper oxide resulting in a defect called pink ring or haloing around the drilled holes.

Double-treated copper foil is sometimes used as an alternative to the brown or black oxide process. Adhesion between the innerlayer, double treated copper foil and polyimide or epoxy resins is acceptable with the typical peel strength values of >3 pounds per inch for polyimide resins and >6 pounds per inch for epoxy resins. The interface between the double treated copper foil surface and these resins is stronger than that when brown or black oxide is used and is, therefore, very resistant to fracturing delamination, and acid attack or pink ring defects. However, double treated copper foil has not gained wide acceptance by multilayer PCB manufacturers because of its high cost.

Japanese Patent Application Publication (Kokoku) No. 60-15654 discloses a method for adhesively attaching a chrome-treated layer of copper foil to a resin substrate. In a first embodiment the chrome-treated layer is formed on the rough or matte side of the copper foil. This chrome-treated layer is treated with a solution of a silane coupling agent represented by the formula $YRSiX_3$, wherein Y is a functional group that is reactive with a high polymer, R is a bonding group which includes a chain-like or a cyclic hydrocarbon connecting Y and Si, and X is a hydrolyzable organic or inorganic group. In a second embodiment the chrome-treated layer is first formed on the rough side of the copper foil and is then impregnated with a silane coupling agent represented by the above formula. With each embodiment the treated surface is bonded to the resin substrate.

Japanese Patent Application Publication (Kokoku) No. 2-19994 discloses copper foil for use in making printed circuits wherein a layer of zinc or zinc alloy is formed on the rough or matte side of the copper foil. A chrome-treated layer is formed on the zinc or zinc alloy layer. This chrome-treated layer is treated with a silane coupling agent represented by the formula $YRSiX_3$, wherein Y is a functional group that is reactive with a high polymer, R is a bonding group which includes a chain-like or a cyclic hydrocarbon connecting Y and Si, and X is a hydrolyzable organic or inorganic group.

U.S. Pat. No. 5,071,520 discloses a technique for improving the peel strength of wrought or electrolytically deposited copper foil having an anti-tarnish treatment applied thereto. The anti-tarnish treatment is applied using chromium or the combination of chromium and zinc. The treated foil is then subjected to a rinse containing a silane coupling agent.

U.S. Pat. No. 3,644,166 discloses a copper-clad glass epoxy laminate made with a treated copper foil sheet having an extremely thin oxidation-resistant amino-silane film applied to it. The copper foil is treated with chemicals on the bonding side to improve adhesion resulting in copper oxides being incorporated and made a part of the grain structure of the copper foil surface. The amino-silane film coats the toughened copper surface to prevent oxide transfer to the organic support and oxidation of the copper foil. The reference states that the amino-silane film can be applied to nontreated copper foil and to any other conductor metals if oxidation problems exist with such metals.

SUMMARY OF THE INVENTION

This invention relates to a foil having an adhesion promoting layer overlying at least one side of said foil. The adhesion promoting layer is suitable for enhancing adhesion between the foil and another substrate. The adhesion promoting layer is derived from a composition comprising silanes (A) and (B).

Silane (A) is at least one compound represented by the formula

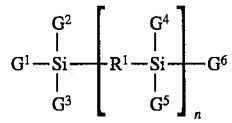

wherein $G^1$, $G^2$, $G^3$, $G^4$, $G^5$ and $G^6$ are independently halogen, hydrocarbyloxy, or hydroxy groups; $R^1$ is a hydrocarbon group or nitrogen-containing hydrocarbon group; and n is zero or 1.

Silane (B) is at least one compound represented by the formula

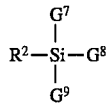

wherein $R^2$ is an organofunctional group, said organofunctional group being reactive with or having an affinity for said another substrate; and $G^7$, $G^8$ and $G^9$ are independently halogen, hydrocarbyloxy, or hydroxy groups.

DESCRIPTION OF THE PREFERRED EMBODIMENTS

The foil used with this invention is preferably a copper or copper-based alloy foil. These foils are well known in the art and are made using one of two techniques. Wrought or rolled foil is produced by mechanically reducing the thickness of a copper or copper alloy strip or ingot by a process such as rolling. Electrodeposited foil is produced by electrolytically depositing copper ions on a rotating cathode drum and then peeling the deposited strip from the cathode. Electrodeposited copper foils are especially preferred.

The copper foils typically have nominal thicknesses ranging from about 0.0002 inch to about 0.02 inch. Foil thickness is sometimes expressed in terms weight and typically the foils of the present invention have weights or thicknesses ranging from about ⅛ to about 14 oz/ft².

Electrodeposited copper foils have a smooth or shiny (drum) side and a rough or matte (copper deposit growth front) side. The inventive adhesion promoting layer can be adhered to either side of the foil and in some instances is adhered to both sides.

In one embodiment, the side or sides of the foil (electrodeposited or wrought) to which the adhesion-promoting layer is adhered is a "standard-profile surface," "low-profile surface" or "very-low-profile surface." The term "standard-profile surface" is used herein to refer to a foil surface having an $R_{tm}$ of about 10 µm or less. The term "low-profile surface" refers to a foil surface having an $R_{tm}$ of about 7 µm or less. The term "very-low-profile surface" refers to a foil surface having an $R_{tm}$ of about 4 µm or less. $R_{tm}$ is the mean of the maximum peak-to-valley vertical measurement from each of five consecutive sampling measurements, and can be measured using a Surftronic 3 profilometer marketed by Rank Taylor Hobson, Ltd., Leicester, England.

Although the inventive foils can be subjected to a surface roughening treatment prior to the application of the adhesion promoting layer, it is a significant advantage of the invention that desired adhesive characteristics for the foil can be achieved without subjecting the foil to an added surface roughening treatment. Thus, in one embodiment of the invention, the foil is characterized by the absence of any added surface roughening treatment on the side or sides to which the adhesion-promoting layer is adhered. The term "added surface roughening treatment" refers to any treatment performed on a base or raw foil that increases the roughness of the surface of the foil. These treatments include copper deposited electrolytically in nodular or powder form, or copper oxide which grows nodular or dendritic. In one embodiment, mechanical roughness imparted to wrought copper foil during rolling or by subsequent abrasion which increases roughness beyond that of a standard profile surface is considered to be an added surface roughening treatment. In one embodiment, roughness imparted to an electrodeposited copper foil during electro-deposition which increases roughness beyond that of a standard profile surface is considered to be an added surface roughening. In one embodiment, any roughness imparted to the raw or base copper foil that increases the roughness of said foil beyond that of a standard profile surface is considered to be an added surface roughening treatment. In one embodiment, any roughness imparted to the raw or base copper foil that increases the roughness of said foil beyond that of a low-profile surface is considered an added surface roughening treatment. In one embodiment, any roughness imparted to the raw or base copper foil that increases the roughness of said foil beyond that of a very low-profile surface is considered an added surface roughening treatment.

As indicated above, it is within the scope of the invention to apply to foils which have been subjected to an added surface roughening treatment the inventive adhesion promoting layer. Thus, in one embodiment, one or both sides of the foil are treated with a roughened layer of copper or copper oxide prior to the application of the adhesion promoting layer. The copper can be deposited electrolytically in nodular or powder form. The copper oxide can grow nodular or dendritic.

In one embodiment, the side or sides of the base or raw foil to which the adhesion-promoting layer is adhered is untreated prior to the application of the adhesion-promoting layer to the foil. The term "untreated" is used herein to refer to raw or base foil that has not undergone subsequent treatment for the purpose of refining or enhancing the foil properties.

In one embodiment, the side or sides of the base or raw foil to which the adhesion-promoting layer is adhered is treated, prior to the application of the adhesion-promoting layer, with one or more surface treatment layers for the purpose of refining or enhancing the foil properties. Any side of the foil which does not have an adhesion-promoting layer applied to it can, optionally, also have one or more of such treatment layers applied to it. These surface treatments are known in the art.

In one embodiment one or both sides of the foil are treated with at least one metallic layer, the metal in said metallic layer being selected from the group consisting of indium, zinc, tin, nickel, cobalt, copper-zinc alloy, copper-tin alloy, and mixtures of two or more thereof, prior to the application of the adhesion promoting layer. Metallic layers of this type are sometimes referred to as barrier layers. These metallic layers preferably have thicknesses in the range of about 0.01 to about 1 micron, more preferably about 0.05 to about 0.1 micron.

In one embodiment one or both sides of the foil are treated with at least one metallic layer, the metal in said metallic layer being tin, chromium, chromium-zinc alloy, zinc, nickel, molybdenum, aluminum, or a mixture of two or more thereof, prior to the application of the adhesion promoting layer. Metallic layers of this type are sometimes referred to as stabilization layers. These metallic layers preferably have thicknesses in the range of about 0.005 to about 0.05 micron, more preferably about 0.01 to about 0.02 micron.

In one embodiment, one or both sides of the foil are first treated with at least one barrier layer, then at least one stabilization layer, as discussed above, prior to the application of the adhesion promoting layer.

In one embodiment, one or both sides of the foil are treated with at least one roughened layer of copper or copper oxide, then at least one barrier layer of the type discussed above prior to the application of the adhesion promoting layer.

In one embodiment, one or both sides of the foil are treated with at least one roughened layer of copper or copper oxide, then at least one stabilization layer of the type discussed above is adhered to the layer of copper or copper oxide prior to the application of the adhesion promoting layer.

In one embodiment, one or both sides of the foil are treated with at least one roughened layer of copper or copper oxide, then at least one barrier layer of the type discussed above is adhered to the roughened layer, then at least one stabilization layer is adhered to the barrier layer prior to the application of the adhesion promoting layer.

The adhesive promoting layer is adapted for enhancing adhesion between the foil and another substrate. The other substrate is preferably a non-conductive substrate and in one embodiment is a polymeric resin substrate. The adhesion-promoting layer is applied to one or both sides of the foil, the foil surface to which the adhesion promoting layer is applied being untreated or treated as discussed above. The adhesion-promoting layer is derived from a composition comprising a mixture of at least two silanes, one being silane (A) and the other being silane (B).

Silane (A) is a compound represented by the formula

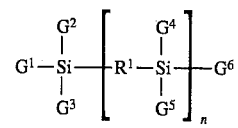

wherein $G^1$, $G^2$, $G^3$, $G^4$, $G^5$ and $G^6$ are independently halogen, hydrocarbyloxy, or hydroxy groups; $R^1$ is a hydrocarbon group or nitrogen-containing hydrocarbon group; and n is zero or 1. In one embodiment each of $G^1$, $G^2$, $G^3$, $G^4$, $G^5$ and $G^6$ is independently chloro, alkoxy, alkoxyalkoxy or alkoxyalkoxyalkoxy, and $R^1$ is an alkylene or an arene group of up to about 10 carbon atoms, or a monoamino- or polyamino-substituted alkylene or arene group of up to about 10 carbon atoms. In one embodiment each of $G^1$, $G^2$, $G^3$ and $G^6$ is an alkoxy, alkylalkoxy, alkoxyalkoxy or alkoxyalkoxyalkoxy group of up to about 10 carbon atoms, and n is zero.

Examples of silane (A) include tetramethoxysilane, tetraethoxysilane, tetrapropoxysilane, tetra-n-butoxysilane, tetrakis(2-ethoxyethoxy)silane, tetrakis(2-ethylbutoxy)silane, tetrakis(2-ethylhexoxy)silane, tetrakis(methoxyethoxyethoxy)silane, tetrakis(2-methoxyethoxy)silane, tetrakis(1-methoxy-2-propoxy)silane, bis[3-(triethoxysilyl)propyl] amine, bis[3-(trimethoxysilyl)propyl]ethylenediamine, 1,2-bis(trimethoxysilyl)ethane, bis(trimethoxysilylethyl)benzene, 1,6-bis(trimethoxysilyl) hexane, 1,2-bis(trichlorosilyl)ethane, 1,6-bis(trichlorosilyl) hexane, and 1,8-bis(trichlorosilyl)octane.

Silane (B) is a compound represented by the formula

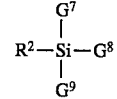

wherein $R^2$ is an organofunctional group, said organofunctional group being reactive with or having an affinity for said another substrate; and $G^7$, $G^8$ and $G^9$ are independently halogen, hydrocarbyloxy, or hydroxy groups. In one embodiment, $R^2$ is an amino-, hydroxy-, and/or alkoxy-containing hydrocarbon group. In one embodiment each of $G^7$, $G^8$ and $G^9$ is chloro, methoxy or ethoxy.

Examples of silane (B) include N-(2-aminoethyl)-3-aminopropyl tdmethoxy silane; 3-(N-styrylmethyl-2-aminoethylamino)propyl trimethoxy silane; 3-aminopropyl triethoxy silane; bis(2-hydroxyethyl)-3-aminopropyl triethoxy silane; β-(3,4-epoxy cyclohexyl)ethyl trimethoxy silane; 3-glycidoxypropyltrimethoxy silane; 3-methacryloxypropyl trimethoxy silane; 3-chloropropyl trimethoxy silane; vinyl trichloro silane; vinyl triethoxy silane; vinyl-tris(2-methoxyethoxy)silane; aminopropyl trimethoxy silane; N-methyl amino propyl trimethoxy silane; and N-phenylaminopropyl trimethoxy silane.

Examples of silane (B) also include 3-acetoxypropyl trimethoxy silane, N-(3-acryloxy-2-hydroxypropyl)-3-aminopropyl triethoxy silane, 3-acryloxypropyl trimethoxy silane, allyl triethoxy silane, allyl trimethoxy silane, 4-aminobutyl triethoxy silane, (aminoethylaminomethyl)phenethyl trimethoxy silane, N-(2-aminoethyl-3-aminopropyl)trimethoxy silane, N-(2-aminoethyl-3-aminopropyl)tris(2-ethylhexoxy) silane, 6-(aminohexylaminopropyl)trimethoxy silane, aminophenyl trimethoxy silane, 3-(1-aminopropoxy)-3,3-dimethyl-1-propenyl trimethoxy silane, 3-aminopropyltris(methoxyethoxyethoxy)silane, 3-aminopropyl triethoxy silane, 3-aminopropyl trimethoxy silane, Ω-aminoundecyl trimethoxy silane, 3-[2-N-benzylaminoethylaminopropyl]trimethoxy silane, bis(2-hydroxyethyl)-3-aminopropyl triethoxy silane, 8-bromooctyl trimethoxy silane, bromophenyl trimethoxy silane, 3-bromopropyl trimethoxy silane, 2-chloroethyl triethoxy silane, p-(chloromethyl) phenyl trimethoxy silane, chloromethyl triethoxy silane, chlorophenyl triethoxy silane, 3-chloropropyl triethoxy silane, 3-chloropropyl trimethoxy silane, 2-(4-chlorosulfonylphenyl) ethyl trimethoxy silane, 3-(cyanoethoxy)-3,3-dimethyl-1-propenyltrimethoxy silane, 2-cyanoethyl triethoxy silane, 2-cyanoethyl trimethoxy silane, (cyanomethylphenethyl)trimethoxy silane, 3-cyanopropyl triethoxy silane, 3-cyclopentadienylpropyl triethoxy silane, (N,N-diethyl-3-aminopropyl)trimethoxy silane, diethylphosphatoethyl triethoxy silane, (N,N-dimethyl-3-aminopropyl)trimethoxy silane, 2-(diphenylphosphino) ethyl triethoxy silane, 2-(3,4-epoxycyclohexyl)ethyl trimethoxy silane, 3-iodopropyl trimethoxy silane, 3-isocyanatopropyl triethoxy silane, 3-mercaptopropyl triethoxy silane, 3-mercaptopropyl trimethoxy silane, methacryloxypropenyl trimethoxy silane, 3-methacryloxypropyl trimethoxy silane, 3-methacryloxypropyltfis (methoxyethoxy) silane, 3-methoxypropyl trimethoxy silane, N-methylaminopropyl trimethoxy silane, O-4-methylcoumarinyl-N-[3-(triethoxysilyl)propyl]carbamate, 7-oct-1-enyl trimethoxy silane, N-phenethyl-N'-triethoxysilyl propylourea, N-phenylaminopropyl trimethoxy silane, 3-(N-styrylmethyl-2-aminoethylamino)propyl trimethoxy silane, 3-thiocyanatopropyl triethoxy silane, N-(3-triethoxysilylpropyl) acetylglycinamide, N-(triethoxysilylpropyl)dansylamide, N-[3-(triethoxysilyl)propyl]-2,4-dinitrophenylamine, triethoxysilylpropylethyl carbamate, N-[3-(triethoxysilyl)propyl]-4,5-dihydroimidazole, N-triethoxysilylpropyl-o-menthocarbamate, 3-(triethoxysilylpropyl)-p-nitrobenzamide, N-[3-(triethoxysilyl) propyl]phthalamic acid, N-(triethoxysilylpropyl)urea, 1-trimethoxysilyl-2-(p,m-chloromethyl)-phenylethane, 2-(trimethoxysilyl)ethylphenylsulfonylazide, β-trimethoxysilyl ethyl-2-pyridine, trimethoxysilyloctyltrimethyl ammonium bromide, trimethoxysilylpropyl cinnamate, N(3-trimethoxysilylpropyl)-N-methyl-N,N-diallylammonium chloride, trimethoxysilylpropyldiethylenetriamine, N-[(3-trimethoxysilyl)propyl]ethylenediamine triacetic acid trisodium salt, trimethoxysilylpropylisothiouronium chloride, N-(3-trimethoxysilylpropyl)pyrrole, N-trimethoxysilylpropyl tri-N-butylammonium bromide, and N-trimethoxysilylpropyl-N,N,N-trimethylammonium chloride.

Examples of silane (B) also include vinyl triethoxy silane, vinyl triisopropoxy silane, vinyl trimethoxy silane, vinyl tris-t-butoxy silane, vinyl tris (2-methoxyethoxy) silane, vinyl triisopropenoxy silane, and vinyl tris (t-butylperoxy) silane.

Examples of silane (B) also include 2-acetoxyethyl trichloro silane, 3-acryloxypropyl trichloro silane, allyltrichloro silane, 8-bromooctyl trichloro silane, bromophenyl trichloro silane, 3-bromopropyl trichloro silane, 2-(carbomethoxy)ethyl trichloro silane, 1-chloroethyl trichloro silane, 2-chloroethyl trichloro silane, p-(chloromethyl) phenyl trichloro silane, chloromethyl trichloro silane, chlorophenyl trichloro silane, 3-chloropropyl trichloro silane, 2-(4-chlorosulfonylphenyl)ethyl trichloro silane, (3-cyanobutyl) trichloro silane, 2-cyanoethyl trichloro silane, 3cyanopropyl trichloro silane, (dichloromethyl) trichloro silane, (dichlorophenyl) trichloro silane, 6-hex-1-enyl trichloro silane, 3-methacryloxypropyl trichloro silane, 3-(4-methoxyphenyl)propyl trichloro silane, 7-oct-1-enyl trichloro silane, 3-(N-phthalimido) propyl trichloro silane, 1-tfichlorosilyl-2-(p,m-chloromethylphenyl) ethane, 4-[2-(trichlorosilyl)ethyl]cyclohexene, 2-[2-(trichlorosilyl)ethyl] pyridine, 4-[2-(trichlorosilyl)ethyl]pyridine, 3-(trichlorosilyl)propylchloroformate, and vinyl trichloro silane.

In one embodiment the weight ratio between silane (A) and silane (B) is preferably from about 5:95 to about 95:5, more preferably from about 10:90 to about 90:10.

In one embodiment the inventive adhesion promoting layer is derived from a composition comprising N-(2-aminoethyl-3-aminopropyl)trimethoxy silane, 3-aminopropyl trimethoxy silane or 3-glycidoxypropyltrimethoxy silane in combination with tetraethoxy silane or tetramethoxysilane.

While not wishing to be bound by theory, it is believed that in at least one embodiment of the invention, the enhanced adhesion that results when silanes (A) and (B) are combined is due to a crosslinking reaction between these two silanes.

The application of the adhesion-promoting layer to the foil surface can be effected by applying a neat mixture of the silanes (A) and (B) to the surface of the foil. However, it is generally preferred to mix the silanes in a suitable medium prior to applying them to the foil surface. The silanes can either be mixed in one step with the medium, or they can be mixed separately with the medium, and then the resulting mixtures are combined prior to application to the foil surface. The silane mixture can be applied to the foil surface in the form of a dispersion or solution in water, a mixture of water and alcohol, or a suitable organic solvent, or as an aqueous emulsion of the silane mixture, or as an aqueous emulsion of a solution of the silane mixture in a suitable organic solvent. Conventional organic solvents may be used. These include alcohols, ethers, ketones, and mixtures of these with aliphatic or aromatic hydrocarbons or with amides such as N,N-dimethylformamide. Useful solvents are those having good wetting and drying properties and include, for example, water, ethanol, isopropanol, and methylethylketone. Aqueous emulsions of the silane mixture may be formed in conventional manner using conventional dispersants and surfactants, including non-ionic dispersants. The concentration of the silane mixture in such solutions or emulsions can be up to about 100% by weight of such silanes, but preferably is in the range of about 0.1% to about 5% by weight, more preferably about 0.3% to about 1% by weight. The process of applying the adhesion-promoting layer may be repeated, if desired, several times. However, a single coating step gives generally useful results and, hence, the use of a single coating step is generally preferred. The adhesion-promoting layer may be applied to the foil surface using known application methods which include reverse roller coating, doctor blade coating, dipping, painting and spraying.

The application of the adhesion-promoting layer to the foil surface is typically effected at a temperature of preferably about 15° C. to about 45° C., more preferably about 20° C. to about 30° C. Following application of the adhesion-promoting layer to the foil surface, the adhesion-promoting layer can be heated to a temperature of preferably about 60° C. to about 170° C., more preferably about 90° to 150° C., for preferably about 0.03 to about 5 minutes, more preferably about 0.2 to about 2 minutes to enhance drying of the surface. The dry film thickness of the adhesion-promoting layer on the foil is preferably from about 0.002 to about 0.1 microns, more preferably about 0.005 to about 0.02 microns.

The inventive copper foils with adhesion-promoting layer applied thereto preferably have a matte-side roughness, $R_{tm}$, of about 2 to about 18 μm, more preferably about 4 to about 11 μm, more preferably about 5 to about 8 μm. In one embodiment of the invention, these foils have weights of about ½ ounce per square foot and the $R_{tm}$ of the matte side is preferably about 2 to about 12 μm, more preferably about 4 to about 8 μm. In one embodiment, these foils have weights of about 1 ounce per square foot and the $R_{tm}$ of the matte side is preferably about 2 to about 16 μm, more preferably about 5 to about 9 μm. In one embodiment, these foils have weights of about 2 ounces per square foot and the $R_{tm}$ of the matte side is preferably about 6 to about 18 μm, more preferably about 8 to about 11 μm. The $R_{tm}$ for the shiny side of these foils is preferably less than about 4 μm, more preferably less than about 3 μm, and is preferably in the range of about 1.5 to about 3 μm, more preferably in the range of about 2 to about 2.5 μm.

The following examples are provided for purposes of illustrating the invention. Unless otherwise indicated, in the following example as well as throughout the specification and claims, all parts and percentages are by weight, all temperatures are in degrees centigrade, and all pressures are atmospheric.

EXAMPLE 1

A first 0.5% by weight aqueous solution of N-(2-aminoethyl)-3-aminopropyltrimethoxy silane in deionized water is prepared. A second 0.5% by weight aqueous solution of tetraethoxy silane in deionized water is prepared. The two solutions are mixed together to form a third solution, the weight ratio of the second solution to the first solution being 9:1. An electrodeposited copper foil sample having a weight of 1 oz/ft² is dipped in the third solution for thirty seconds, squeegeed to remove excess solution from the smooth side and air dried. The sample is heated in an oven at 90±5° C. for one minute to provide a coated sample. The coated sample and an uncoated copper foil identical to the coated sample but for the coating are laminated to an epoxy prepreg. The samples are scribed with ¼" lines and evaluated for initial peel strength with the following results:

| Sample | Initial Peel Strength (lbs/inch) |
|---|---|
| Coated | 7.32 |
| Uncoated | 2.73 |

EXAMPLE 2

An electrodeposited copper foil that has been treated with a metallic layer of chromium-zinc alloy and has an $R_{tm}$ of 4–6 μm is dipped in an aqueous solution containing 0.45% by weight of (A) tetraethoxysilane and 0.05% by weight of (B) N-(2-aminoethyl-3-aminopropyl)trimethoxysilane. After 30 seconds the foil is removed and squeegeed to remove excess moisture. The foil is air-dried for 1 to 10 minutes, then baked in an oven for one minute at 90±5° C. The foil is laminated to either a difunctional or tetrafunctional epoxy prepreg and patterned into 0.25-inch lines. The initial peel strength of these lines is measured and indicated below. Comparative data is also provided for otherwise identical foil lines except that: in one instance, no adhesion promoting layer is used; in one instance, only (A) tetraethoxysilane is used and; in one instance, only (B) N-(2-aminoethyl-3-aminopropyl)trimethoxysilane is used.

| Adhesion Promoting Layer | Prepreg | Initial Peel Strength (lbs/inch) | |
|---|---|---|---|
| | | Run No. 1 | Run No. 2 |
| Mixture (A) + (B) | Difunctional Epoxy | 8.40 | 8.71 |
| (A) Alone | Difunctional Epoxy | 7.13 | 7.21 |
| (B) Alone | Difunctional Epoxy | 5.25 | 4.56 |
| None | Difunctional Epoxy | 4.27 | 4.40 |
| Mixture (A) + (B) | Tetrafunctional Epoxy | 5.91 | 5.65 |
| (A) Alone | Tetrafunctional Epoxy | 2.57 | 3.53 |
| (B) Alone | Tetrafunctional Epoxy | 0.91 | 1.41 |
| None | Tetrafunctional Epoxy | 0.91 | 0.97 |

EXAMPLE 3

A first 0.5% by weight aqueous solution of (B) N-(2-aminoethyl)-3-aminopropyltrimethoxy silane in deionized water is prepared. A second 0.5% by weight aqueous solution of (A) tetraethoxy silane in deionized water is prepared. The two solutions are mixed together to form a third solution, the weight ratio of the second solution to the first solution being 1:1. An electrodeposited copper foil sample having a weight of 1 oz/ft² is dipped in the third solution for thirty seconds, squeegeed to remove excess solution and air dried. The sample is baked in an oven for one minute at 90±5° C. It is laminated and patterned as described in Example 2. The initial peel strength of the patterned lines is measured and indicated below. Comparative data is also provided for otherwise identical foil lines except that: in one instance, no adhesion promoting layer is used; in one instance, only (A) tetraethoxysilane is used; and, in one instance, only (B) N-(2-aminoethyl-3-aminopropyl)trimethoxysilane is used.

| Adhesion Promoting Layer | Prepreg | Initial Peel Strength (lbs/inch) |
|---|---|---|
| Mixture (A) + (B) | Difunctional Epoxy | 8.24 |
| (A) Alone | Difunctional Epoxy | 7.17 |
| (B) Alone | Difunctional Epoxy | 4.90 |
| None | Difunctional Epoxy | 4.34 |
| Mixture (A) + (B) | Tetrafunctional Epoxy | 5.66 |
| (A) Alone | Tetrafunctional Epoxy | 3.05 |
| (B) Alone | Tetrafunctional Epoxy | 1.16 |
| None | Tetrafunctional Epoxy | 0.94 |

EXAMPLE 4

The same type of foil as used in Example 2 is dipped in an aqueous solution containing 0.45% by weight (A) tetraethoxysilane and 0.05% by weight (B) 3-glycidoxypropyltrimethoxysilane for 30 seconds, removed and then squeegeed to remove excess moisture. The foil is air-dried for 1 to 10 minutes and baked in an oven for one minute at 90±5° C. The foil is laminated and patterned as described in Example 3. The initial peel strength of the patterned lines is measured and indicated below. Comparative data is also provided for otherwise identical foil lines except that: in one instance, no adhesion promoting layer is used; in one instance, only (A) tetraethoxy silane is used; and, in one instance, only (B) 3-glycidoxypropyltrimethoxysilane is used.

| Adhesion Promoting Layer | Prepreg | Initial Peel Strength (lbs/inch) |
|---|---|---|
| Mixture (A) + (B) | Difunctional Epoxy | 8.12 |
| (A) Alone | Difunctional Epoxy | 7.17 |
| (B) Alone | Difunctional Epoxy | 7.76 |
| None | Difunctional Epoxy | 4.34 |
| Mixture (A) + (B) | Tetrafunctional Epoxy | 4.07 |
| (A) Alone | Tetrafunctional Epoxy | 3.05 |
| (B) Alone | Tetrafunctional Epoxy | 1.82 |
| None | Tetrafunctional Epoxy | 0.94 |

EXAMPLE 5

A first 0.5% by weight aqueous solution of (B) 3-glycidoxypropyltrimethoxy silane in deionized water is prepared. A second 0.5% by weight aqueous solution of (A) tetraethoxy silane in deionized water is prepared. The two solutions are mixed together at the weight ratios indicated below to form a series of treating solutions. Electrodeposited copper foil samples having an $R_{tm}$ of 8–10 μm and coated with a first metallic layer of copper-zinc alloy which is adhered to the copper surface and a second metallic layer of zinc-chromium alloy which is adhered to the first metallic layer are dipped in the treating solution for 30 seconds each, removed and then squeegeed to remove excess moisture. The foils are dried, baked and laminated to either a difunctional or tetrafunctional epoxy prepreg as in Example 2 and tested for initial peel strength. A control wherein no adhesion promoting layer is added is also tested. The results are indicated below.

| Ratio of (A):(B) | Difunctional Epoxy Initial Peel Strength (lbs/inch) | Tetrafunctional Epoxy Initial Peel Strength (lbs/inch) |
|---|---|---|
| 1:1 | 11.61 | 8.83 |
| 1.2:1 | 11.65 | 8.81 |
| 1.5:1 | 11.73 | 8.47 |
| 2.3:1 | 11.71 | 8.61 |
| 4:1 | 11.65 | 8.92 |
| 9:1 | 11.55 | 8.57 |
| Control | 9.62 | 4.95 |

EXAMPLE 6

An aqueous solution containing 0.25% by weight tetraethoxysilane and 0.25% by weight 3-glycidoxypropyltrimethoxysilane is prepared. A copper foil having on one side a copper-copper oxide nodular roughening treatment applied followed by a first metallic layer of a copper-zinc alloy over the roughening treatment and then a second metallic layer of a zinc-chrome mixture over the first metallic layer is prepared. The zinc-chrome mixture is also applied to the opposite side of the foil. The aqueous solution is sprayed on to the foil. The sprayed foil is baked at 135±5° C. for 5 seconds. The foil is laminated to a variety of prepregs and patterned as indicated in Example 2. The initial peel strengths are measured for each sample with the results being indicated below. The results for comparative samples wherein identical foil samples are tested but for the fact that no adhesion promoting layers are applied are also indicated below.

| Adhesion Promoting Layer | Prepreg | Initial Peel Strength (lbs/inch) |
|---|---|---|
| Yes | Difunctional Epoxy | 12.84 |
| No | Difunctional Epoxy | 11.38 |
| Yes | Tetrafunctional Epoxy | 10.37 |
| No | Tetrafunctional Epoxy | 9.49 |
| Yes | Multifunctional Epoxy | 6.35 |
| No | Multifunctional Epoxy | 6.16 |
| Yes | Polyimide | 8.87 |
| No | Polyimide | 6.35 |

EXAMPLE 7

An aqueous solution containing 0.25% by weight (A) tetramethoxysilane and 0.25% by weight of (B) N-[3-(triethoxysilyl)propyl]-4,5-dihydroimidazole is prepared by forming separate solutions of the silanes, then combining the separate solutions. An electrodeposited copper foil with an $R_{tm}$ of 4–6 μm on the rough side, a metallic layer of copper-zinc alloy adhered to the rough side, and a second metallic layer of chromium-zinc alloy adhered to both sides of the foil is prepared. The chromium-zinc alloy is adhered to the copper-zinc layer on the rough side and to the copper surface of the foil on the shiny side. The foil is coated with the above solution for thirty seconds, removed and then squeegeed. The foil is air dried for 10 minutes and baked in an oven for one minute at 90±5° C. The foil is laminated to difunctional epoxy prepreg, and patterned and tested for initial peel strength. The results are indicated below.

| Adhesion Promoting Layer | Initial Peel Strength (lbs/inch) |
|---|---|
| Mixture (A) + (B) | 9.09 |
| (A) alone | 7.72 |
| (B) alone | 6.09 |
| None | 3.97 |

The inventive copper foils can be bonded to dielectric substrates to provide dimensional and structural stability thereto. The adhesion promoting layer of the invention enhances the bond or peel strength between the copper foil and the dielectric substrate. An advantage of the inventive copper foils is that these foils can avoid the application of any added surface toughening, yet exhibit effective bond or peel strength with dielectric substrates. These foils can have a standard profile surface, low-profile surface and even a very low-profile surface, and yet provide acceptable peel strengths. With the inventive foils, either the matte side or shiny side can be effectively bonded to a dielectric substrate.

Useful dielectric substrates may be prepared by impregnating woven glass reinforcement materials with partially cured resins, usually epoxy resins. Other useful resins include amino type resins produced from the reaction of formaldehyde and urea or formaldehyde and melamine, polyesters, phenolics, silicones, polyamides, polyimides, bismaleimides, polyphenyleneoxides, cyanate esters, di-allyl phthlates, phenylsilanes, polybenizimidazoles, diphenyloxides, polytetrafluoroethylenes, and the like, as well as mixtures of two or more thereof. These dielectric substrates are sometimes referred to as prepregs.

In preparing the laminates, it is useful for both the prepreg material and the electrodeposited copper foil to be provided in the form of long webs of material rolled up in rolls. The rolled materials are drawn off the rolls and cut into rectangular sheets. The rectangular sheets are then laid-up or assembled in stacks of assemblages. Each assemblage may comprise a prepreg sheet with a sheet of foil on either side thereof, and in each instance, the side (or one of the sides) of the copper foil sheet with the adhesion-promoting layer adhered thereto is positioned adjacent the prepreg.

The assemblage may be subjected to conventional laminating temperatures and pressures between the plates of laminating presses to prepare laminates comprising sandwiches of a sheet of prepreg between sheets of copper foil. Alternatively, a continuous lamination process may be used where the foil and prepreg are unrolled and passed through a heated press as a continuous web and cut into sheets afterwards.

The prepregs may consist of a woven glass reinforcement fabric impregnated with a partially cured two-stage resin. By application of heat and pressure, the copper foil is pressed tightly against the prepreg and the temperature to which the assemblage is subjected activates the resin to cause curing, that is crosslinking of the resin and thus tight bonding of the foil to the prepreg dielectric substrate. Generally speaking, the laminating operation will involve pressures in the range of from about 250 to about 750 psi, temperatures in the range of from about 175° C. to 235° C. and a laminating cycle of from about 40 minutes to about 2 hours. In one embodiment, a continuous lamination process is used wherein a vacuum is used, the temperature is up to about 125° C., and the lamination time is less than about 10 minutes. The finished laminate may then be utilized to prepare printed circuit boards (PCB).

In one embodiment, the laminate is subjected to a subtractive copper etching process to form electrically conductive lines or an electrically conductive pattern as part of a process for making a multilayered circuit board. A second adhesion-promoting layer is then applied over the etched pattern using the techniques discussed above and then a second prepreg is adhered to the etched pattern; the second adhesion-promoting layer being positioned between and adhered to both the etched pattern and the second prepreg. The techniques for making multilayered circuit boards are well known in the art. Similarly, subtractive etching processes are well known, an example of which is disclosed in U.S. Pat. No. 5,017,271, which is incorporated herein by reference.

A number of manufacturing methods are available for preparing PCBs from laminates. Additionally, there is a myriad of possible end use applications including radios, televisions, computers, etc., for the PCB's. These methods and end uses are known in the art.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

We claim:

1. A copper foil having an adhesion promoting layer overlying at least one side of said foil, said adhesion promoting layer being suitable for enhancing adhesion between said foil and another substrate, said adhesion promoting layer being derived from a composition comprising silanes (A) and (B);

silane (A) being at least one selected from the group consisting of tetramethoxysilane, tetraethoxylsilane, tetrapropoxysilane, tetra-n-butoxysilane, tetrakis(2-ethoxyethoxy)silane, tetrakis(2-ethylbutoxy)silane, tetrakis(2-ethylhexoxy)silane, tetrakis(methoxyethoxy)-silane, tetrakis(2-methoxyethoxy)silane, tetrakis(1-methoxy-2-propoxy)silane, bis[3-(triethoxysilyl)propyl]amine, bis[3-(trimethoxysilyl)propyl]ethylenediamine, bis(trimethoxysilylethyl)benzene, 1,6-bis(trimethoxysilyl)-hexane, 1,2-bis(trichlorosilyl)ethane, 1,6-bis(trichlorosilyl)hexane, and 1,8-bis(trichlorosilyl)octane; and silane (B) being at least one compound represented by the formula

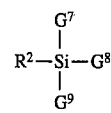

wherein $R^2$ is an organofunctional group, said organofunctional group being reactive with said another substrate; and $G^7$, $G^8$ and $G^9$ are independently halogen, hydrocarbyloxy, or hydroxy groups.

2. The foil of claim 1 wherein said adhesion promoting layer overlies both sides of said foil.

3. The foil of claim 1 wherein said foil is an electrodeposited copper foil.

4. The foil of claim 1 wherein said foil is a wrought copper foil.

5. The foil of claim 1 wherein said one side of said foil is a standard- profile surface.

6. The foil of claim 1 wherein said one side of said foil is a low-profile surface.

7. The foil of claim 1 wherein said one side of said foil is a very low-profile surface.

8. The foil of claim 1 wherein said adhesion promoting layer is adhered to said one side of said foil, and prior to the adherence of said adhesion promoting layer to said one side of said foil said one side of said foil is a raw foil that has not undergone subsequent treatment for the purpose of refining or enhancing the foil properties.

9. The foil of claim 1 wherein at least one roughened layer of copper or copper oxide is positioned between said one side of said foil and said adhesion promoting layer.

10. The foil of claim 1 wherein at least one metallic layer is positioned between said one side of said foil and said adhesion promoting layer, the metal in said metallic layer being selected from the group consisting of indium, zinc, tin, nickel, cobalt, copper-zinc alloy, copper-tin alloy, and a mixture of two or more thereof.

11. The foil of claim 1 wherein at least one roughened layer of copper or copper oxide is adhered to said one side of said foil, at least one metallic layer is adhered to the outer surface of said layer of copper or copper oxide, the metal in said metallic layer being selected from the group consisting of indium, zinc, tin, nickel, cobalt, copper-zinc alloy, copper-tin alloy, and a mixture of two or more thereof, and said adhesion promoting layer is adhered to the outer surface of said metallic layer.

12. The foil of claim 1 wherein at least one metallic layer is positioned between said one side of said foil and said adhesion promoting layer, the metal in said metallic layer being selected from the group consisting of tin, chromium, chromium-zinc alloy, zinc, nickel, molybdenum, aluminum, and mixtures of two or more thereof.

13. The foil of claim 1 wherein at least one roughened layer of copper or copper oxide is adhered to said one side of said foil, at least one metallic layer is adhered to said layer of copper or copper oxide, the metal in said metallic layer being selected from the group consisting of tin, chromium, and chromium-zinc alloy, zinc, nickel, molybdenum, aluminum, and mixtures of two or more thereof, and said adhesion promoting layer is adhered to said metallic layer.

14. The foil of claim 1 Wherein at least one roughened layer of copper or copper oxide adhered to said one side of said foil, at least one first metallic layer is adhered to said roughened layer, the metal in said first metallic layer being selected from the group consisting of indium, zinc, tin, nickel, cobalt, copper-zinc alloy and copper-tin alloy, at least one second metallic layer adhered to said first metallic layer, the metal in said second metallic layer being selected from the group consisting of tin, chromium, chromium-zinc alloy, zinc, nickel, molybdenum, aluminum, and mixtures of two or more thereof, and said adhesion promoting layer is adhered to said second metallic layer.

15. The foil of claim 1 wherein at least one first metallic layer is adhered to said one side of said foil, the metal in said first metallic layer being selected from the group consisting of indium, zinc, tin, nickel, cobalt, copper-zinc alloy and copper-tin alloy, at least one second metallic layer adhered to said first metallic layer, the metal in said second metallic layer being selected from the group consisting of tin, chromium, chromium-zinc alloy, zinc, nickel, molybdenum, aluminum, and mixtures of two or more thereof, and said adhesion promoting layer is adhered to said second metallic layer.

16. The foil of claim 1 wherein the weight ratio between silane (A) and silane (B) is from about 5:95 to about 95:5.

* * * * *